US008963228B2

(12) United States Patent
Chou et al.

(10) Patent No.: US 8,963,228 B2
(45) Date of Patent: Feb. 24, 2015

(54) NON-VOLATILE MEMORY DEVICE INTEGRATED WITH CMOS SOI FET ON A SINGLE CHIP

(71) Applicant: International Business Machines Corporation, Armonk, NY (US)

(72) Inventors: Anthony I. Chou, Beacon, NY (US); Arvind Kumar, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/865,267

(22) Filed: Apr. 18, 2013

(65) Prior Publication Data

US 2014/0312404 A1     Oct. 23, 2014

(51) Int. Cl.
H01L 21/336     (2006.01)
H01L 27/12      (2006.01)
H01L 27/105     (2006.01)

(52) U.S. Cl.
CPC ........ H01L 27/1207 (2013.01); H01L 27/1052 (2013.01)
USPC ............ 257/321; 257/E27.103; 257/E27.112; 257/E29.3

(58) Field of Classification Search
CPC .................. H01L 27/1203; H01L 27/1207
USPC ................. 257/321, E27.103, E27.112, E29.3
See application file for complete search history.

(56) References Cited

U.S. PATENT DOCUMENTS

| | | | |
|---|---|---|---|
| 6,788,574 B1 | 9/2004 | Han et al. | |
| 7,018,895 B2 * | 3/2006 | Ding | 438/257 |
| 8,232,599 B2 | 7/2012 | Chou et al. | |
| 8,299,519 B2 | 10/2012 | Chou et al. | |
| 8,455,938 B2 * | 6/2013 | Nguyen et al. | 257/316 |
| 8,541,276 B2 * | 9/2013 | Ahn et al. | 438/261 |
| 8,652,887 B2 * | 2/2014 | Nguyen et al. | 438/153 |
| 8,652,902 B2 * | 2/2014 | Blomme et al. | 438/265 |
| 2007/0296034 A1 | 12/2007 | Chen et al. | |
| 2008/0237689 A1 | 10/2008 | Kitano | |
| 2009/0080250 A1 * | 3/2009 | Nishihara et al. | 365/185.03 |
| 2011/0163383 A1 | 7/2011 | Chou et al. | |
| 2011/0260233 A1 * | 10/2011 | Nguyen et al. | 257/316 |

OTHER PUBLICATIONS

Skotnicki, T.; "Competitive SOC with UTBB SOI," SOI Conference (SOI), 2011 IEEE International, pp. 1-61, Oct. 3-6, 2011.
C. Fenouillet-Beranger et al., 2009 IEEE, "Hybrid FDSOI/Bulk high-k/Metal gate platform for Low Power (LP) multimedia technology", IEDM09-667, pp. 28.6.1-28.6.4.

* cited by examiner

Primary Examiner — John C Ingham
(74) Attorney, Agent, or Firm — H. Daniel Schnurmann; L. Jeffrey Kelly

(57) ABSTRACT

A structure and method provided for integrating SOI CMOS FETs and NVRAM memory devices. The structure includes a SOI substrate containing a semiconductor substrate, a SOI layer, and a BOX layer formed between the semiconductor substrate and the SOI layer. The SOI substrate includes predefined SOI device and NVRAM device regions. A SOI FET is formed in the SOI device region. The SOI FET includes portions of the BOX layer and SOI layers, an SOI FET gate dielectric layer, and a gate conductor layer. The structure further includes a NVRAM device formed in the NVRAM device region. The NVRAM device includes a tunnel oxide, floating gate, blocking oxide, and control gate layers. The tunnel oxide layer is coplanar with the portion of the BOX layer in the SOI device region. The floating gate layer is coplanar with the portion of the semiconductor layer in the SOI device region.

8 Claims, 7 Drawing Sheets

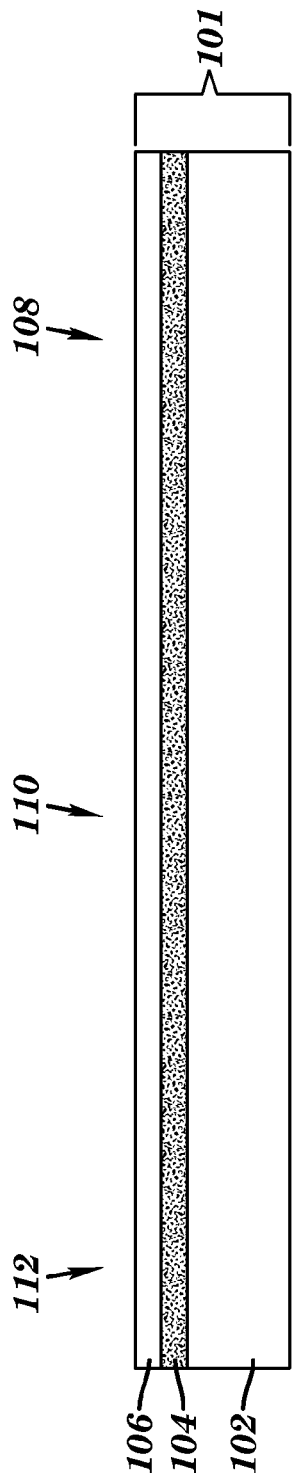
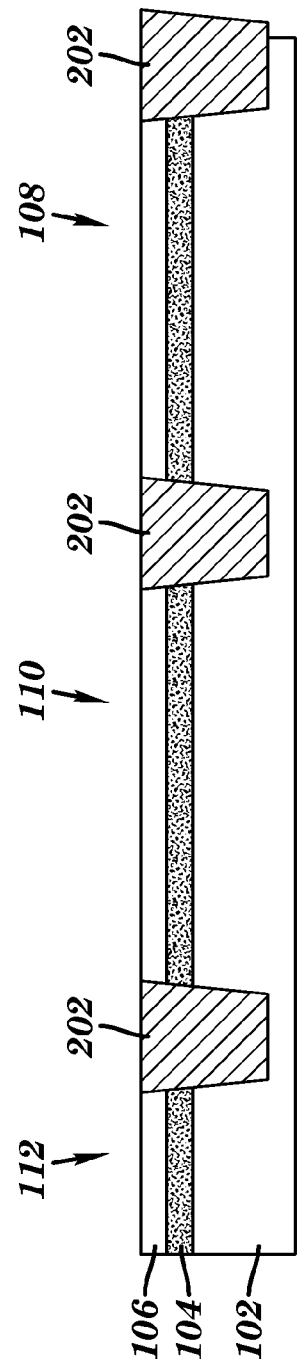

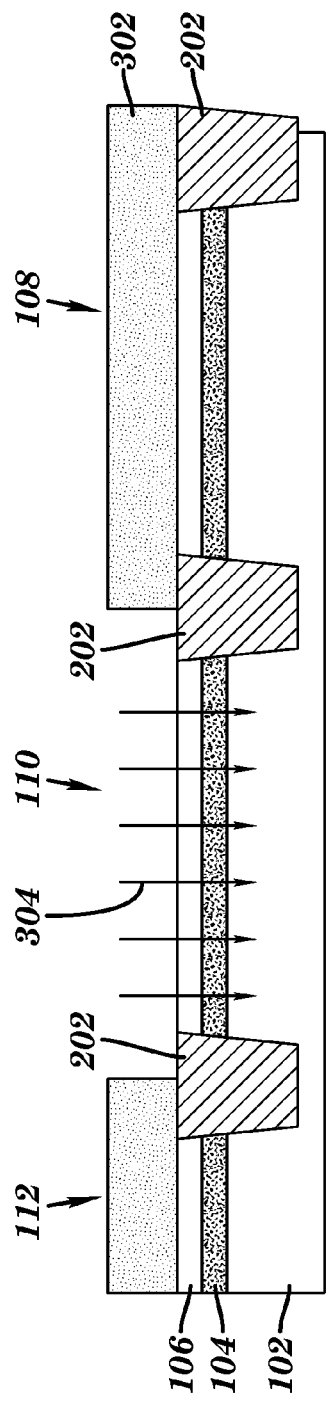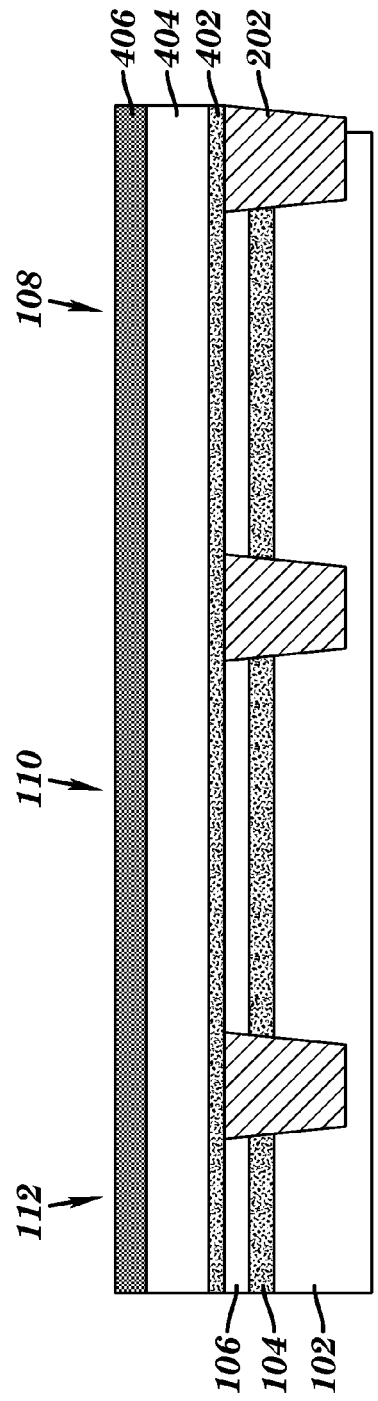

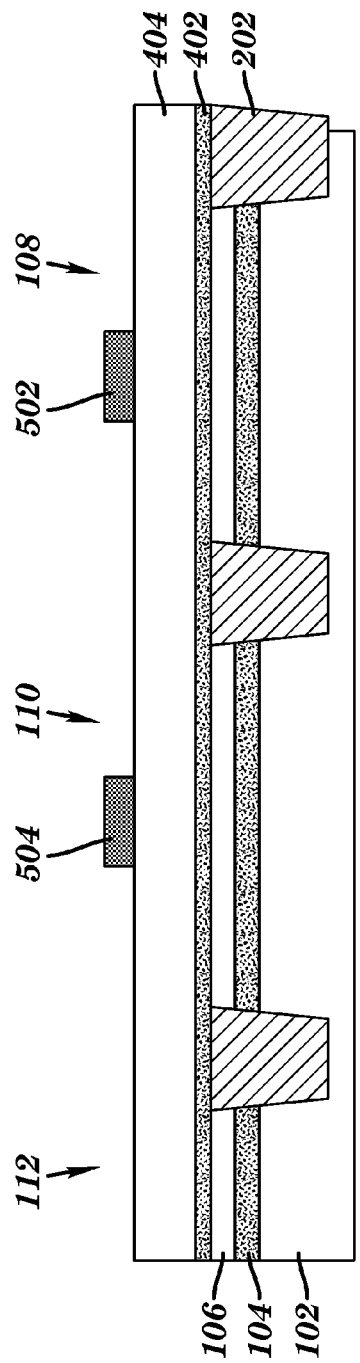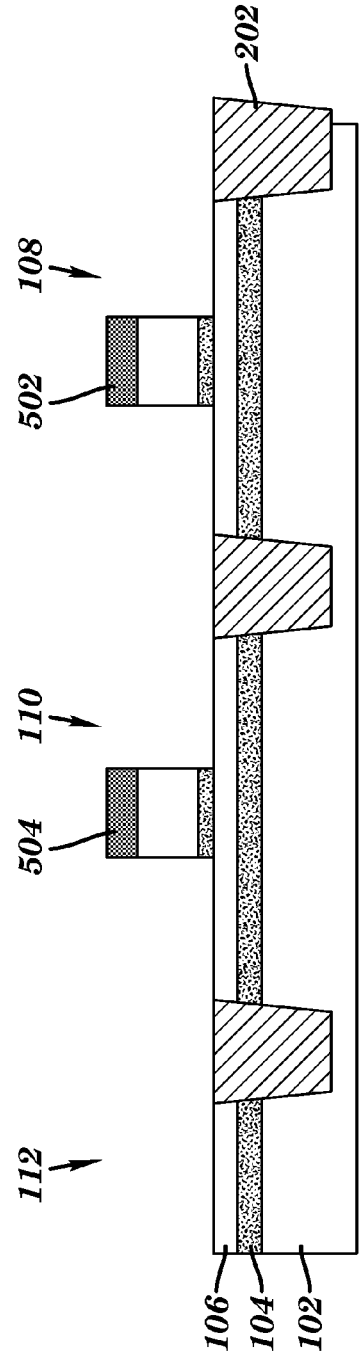

NON-VOLATILE MEMORY DEVICE INTEGRATED WITH CMOS SOI FET ON A SINGLE CHIP

TECHNICAL FIELD

The present invention relates generally to semiconductor devices, and more specifically, to SOI CMOS devices fabricated with embedded non-volatile memory devices.

BACKGROUND

SOI (Semiconductor-on-Insulator) CMOS (Complimentary metal-oxide semiconductor) technology can provide high performance devices, such as field effect transistors (FETs).

Flash memory is a non-volatile memory that can be electrically erased and reprogrammed multiple times. As flash memory is non-volatile, there is no need to have power to maintain the information stored in the chip. Also, flash memory, when packaged in, for example, a "memory card", is very durable. For these reasons, flash memory has gained popularity in the use of memory cards and USB flash drives for storage and transfer of data. Flash memory has also become the dominant technology wherever a significant amount of non-volatile, solid state storage is needed. For example, flash memory is used in many common devices such as gaming consoles, digital cameras, laptop computers, digital audio players, and mobile devices.

In traditional stacked flash memory, each memory cell includes two gates, e.g., a bottom floating gate and a top control gate. The floating gate is disposed above a channel and is completely insulated about its periphery by an oxide layer. That is, an insulator layer is provided at the interface between the channel and the floating gate, as well as between the interface of the floating gate and the control gate.

A single poly non-volatile random-access memory (NVRAM) has been used to provide non-volatile memory functionality integrated with standard CMOS processes, however these single-poly NVRAM techniques typically occupy more chip area. Thus, providing both high performance FETs and NVRAM devices on the same chip while maintaining high NVRAM density is challenging using conventional methods.

It would be desirable to provide a cost-effective structure and method to integrate both SOI CMOS devices and higher density NVRAM devices on a single chip.

SUMMARY

In one aspect, an embodiment of the present invention provides a semiconductor structure. The semiconductor structure includes a semiconductor on insulator (SOI) substrate, a SOI field effect transistor (FET) formed in a SOI device region of the substrate and a nonvolatile memory device formed in a nonvolatile semiconductor memory device region of the SOI substrate.

In another aspect, an embodiment of the present invention provides a SOI FET which includes a first portion of the SOI substrate's buried insulating layer, a first portion of the substrate's semiconductor layer, a gate dielectric layer overlying the first portion of the semiconductor layer, and a gate conductor layer overlying the gate dielectric layer. Furthermore, the nonvolatile memory device includes a tunnel oxide layer overlying the semiconductor substrate, a floating gate layer overlying the tunnel oxide layer, a blocking oxide layer overlying the floating gate layer, and a control gate layer overlying the blocking oxide layer. The tunnel oxide layer of the nonvolatile memory device is coplanar with the first portion of the buried insulating layer in the SOI device region. The floating gate layer of the nonvolatile memory device is coplanar with the first portion of the semiconductor layer in the SOI device region.

In yet another aspect, an embodiment of the present invention provides at least one contact trench formed in a substrate contact region of the SOI substrate adjacent to the nonvolatile semiconductor memory device region. The contact trench includes a contact that is electrically connected to the semiconductor substrate.

In a further aspect, an embodiment of the present invention provides a method of manufacturing a semiconductor structure. The method includes providing a SOI substrate. The SOI substrate includes a semiconductor substrate, a semiconductor layer over the semiconductor substrate, and a buried insulating layer formed between the semiconductor substrate and the semiconductor layer. The SOI substrate includes a predefined SOI device region and a predefined nonvolatile semiconductor memory device region. The method further includes forming a first gate stack in the SOI device region and a second gate stack in the nonvolatile memory device region. The first and second gate stacks include a gate dielectric layer overlying the semiconductor layer and a gate conductor layer overlying the gate dielectric layer. The method further includes selectively removing portions of the semiconductor layer in the nonvolatile semiconductor memory device region to form a floating gate layer of the second gate stack. The method further includes selectively removing portions of the buried insulating layer in the nonvolatile semiconductor memory device region to form a tunnel oxide layer of the second gate stack.

BRIEF DESCRIPTION OF THE SEVERAL VIEWS OF THE DRAWINGS

FIG. 1 is a vertical cross-sectional view of a semiconductor structure comprising an SOI substrate, according to an embodiment of the present invention.

FIG. 2 is a vertical cross-sectional view of the semiconductor structure shown in FIG. 1 after STI regions are formed thereby defining three active areas in an active SOI layer, according to an embodiment of the present invention.

FIG. 3 is a vertical cross-sectional view of the semiconductor structure shown in FIG. 2, after an optional step of performing a threshold adjust ion implantation for a NVRAM device being formed in a nonvolatile semiconductor memory device region of the SOI substrate, according to an embodiment of the present invention.

FIG. 4 is a vertical cross-sectional view of the semiconductor structure shown in FIG. 3 after common gate stack layers and a hard mask have been formed on the surface of the SOI substrate, in accordance with an embodiment of the present invention.

FIG. 5 is a vertical cross-sectional view of the semiconductor structure shown in FIG. 4 after patterning the hard mask layer for subsequent gate stack etching, according to an embodiment of the present invention.

FIG. 6 is a vertical cross-sectional view of the semiconductor structure shown in FIG. 5 after gate stack formation in an SOI device region and the NVRAM device region, in accordance with an embodiment of the present invention.

DETAILED DESCRIPTION

Detailed embodiments of the methods and structures of the present invention are described herein; however, it is to be understood that the disclosed embodiments are merely illustrative of the described methods and structures that can be embodied in various forms. In addition, each of the examples given in connection with the various embodiments of the invention is intended to be illustrative, and not restrictive. Further, the Figures are not necessarily to scale, some features can be exaggerated to show details of particular components. Therefore, specific structural and functional details disclosed herein are not to be interpreted as limiting, but merely as a representative basis for teaching one skilled in the art to variously employ the methods and structures of the present invention.

Figure 13:
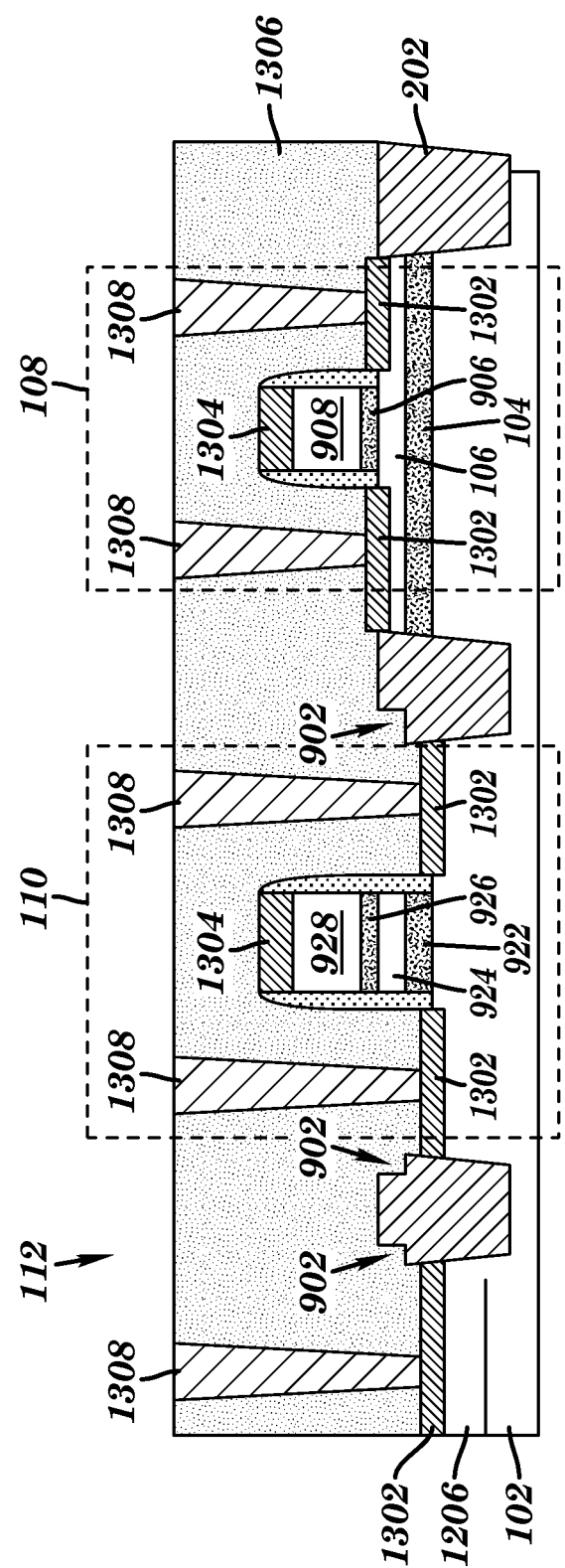
FIG. 13 illustrates a resulting integrated structure which includes both SOI CMOS FET and NVRAM devices formed on a single chip, in accordance with an embodiment of the present invention.

An embodiment of the present invention relates to a method and structure for integrating SOI CMOS FET devices and NVRAM devices on a single chip. FIG. 13 illustrates a schematic cross-section of one embodiment of a semiconductor structure. The structure illustrated in FIG. 13 includes a typical SOI FET device formed in a predefined SOI device region 108 and a nonvolatile semiconductor memory (NVRAM) device formed in a predefined nonvolatile semiconductor memory device region 110. The embodiments of the present invention are not limited to a particular type of SOI FET device (i.e., the SOI FET device may be either n-type field effect transistor (NFET) or a p-type field effect transistor (PFET) or combinations of NFETs and PFETs). Advantageously, an embodiment of the present invention utilizes a thin buried insulating layer of the provided SOI substrate as a tunnel oxide layer of NVRAM device. According to an aspect of the invention, the semiconductor structure presented in an embodiment of the invention utilizes a thin semiconductor layer of the SOI substrate as a floating gate of the NVRAM device. Accordingly, the integrated structure of an embodiment of the present invention is an improvement over prior art as it eliminates one or more process steps and thereby reduces the fabrication complexity, cost and thermal cycles.

The fabrication process begins with a semiconductor-on-insulator (SOI) substrate. FIGS. 1-13 illustrate cross-sections of a substrate during one embodiment of a process for making a semiconductor structure containing CMOS FET devices and NVRAM devices. Referring to FIG. 1, an SOI substrate 101 is provided, which typically includes a semiconductor substrate 102, a buried insulating layer 104, such as a buried oxide (BOX) when the insulator is an oxide (e.g., silicon dioxide ($SiO_2$)), formed on the substrate 102, and a semiconductor layer 106 over the BOX layer 104. The terms "buried insulating layer" and "buried oxide (BOX)" layer are used interchangeably herein. The substrate 102 can be a P-substrate, N-substrate or a hybrid-orientation (i.e. having different crystal orientation than the semiconductor layer 106) substrate. The substrate 102 can comprise any crystalline semiconductor, such as silicon (Si), silicon germanium (SiGe), germanium (Ge), gallium (Ga), arsenic (As) or other semiconductors, including compound semiconductors. The buried insulating layer 104 can be an oxide, nitride, oxynitride or other insulation materials. In a preferred embodiment, the buried insulating layer 104 has a thickness in the range from approximately 3 nm to approximately 20 nm, but the invention is not so limited. The semiconductor layer will be referred to herein as SOI layer 106. The SOI layer 106 can comprise any crystalline semiconductor, such as silicon (Si), silicon germanium (SiGe), germanium (Ge), gallium (Ga), arsenic (As) or other semiconductors, including compound semiconductors. Preferably, the SOI layer 106 has a thickness in the range from approximately 3 nm to approximately 10 nm, but the invention is not so limited. Commercially available SOI substrates often have a thicker SOI layer. Thus, the SOI layer 106 can be thinned using techniques such as oxidative thinning to achieve the desired SOI layer 106 thickness for the techniques described in an embodiment of the present invention. The substrate 102 and SOI layer 106 may be different materials.

Next, at least one active area is defined in the active (SOI) layer. This can be accomplished in a number of different ways, for example, one being by way of shallow trench isolation (STI). Thus, in the exemplary embodiment shown in FIG. 2, STI is being used to define three active areas in the active SOI layer 106 of the substrate 101 of FIG. 1. The three active areas may include SOI device region 108, nonvolatile semiconductor memory device region 110, and substrate contact region 112. The STI isolation process may begin by first forming a dielectric hardmask (not shown) on portions of the SOI layer 106 that will serve as active areas of the device. Portions of the SOI layer 106, buried insulating layer 104, and portions of the substrate 102 outside of the active regions which are not protected by the dielectric hardmask may then be removed, for example, using reactive ion etching (RIE) (these portions of the SOI layer 106, buried insulating layer 104 and substrate 102 that are removed correspond to non-active areas of the device). An STI dielectric material may then be blanket deposited onto the structure, e.g., using chemical vapor deposition (CVD), plasma enhanced CVD (PECVD), atomic or molecular layer deposition (ALD or MLD), spin on dielectric (SOD) or some combination of these techniques. Suitable STI dielectric materials include, but are not limited to, a silicon nitride liner followed by a silicon oxide fill. The deposited STI dielectric material can be planarized using a technique such as chemical-mechanical planarization (CMP) in order to remove the STI dielectric material from the active regions 108, 110, and 112. The STI dielectric material that remains is shown in FIG. 2 as STI regions 202. The dielectric hardmask may then be removed from the active regions using RIE, wet chemical etch, vapor etching or some combination of these techniques to expose the SOI device region 108, the nonvolatile semiconductor memory device region 110, and the substrate contact region 112. Thus, according to this process, the portions of the SOI layer 106, buried insulating layer 104, and substrate 102 that were removed were replaced with an electrically isolating dielectric region (STI region) 202. As shown in FIG. 2, STI regions 202 extend into the substrate 102 to a depth sufficient to provide electrical isolation between the SOI and NVRAM devices (subsequently formed as described below).

In SOI technology, the threshold voltage of a device may be of critical importance and may be controlled by several factors including the doping level in the channel of the device. FIG. 3 illustrates an optional step of performing a threshold adjust ion implantation for the NVRAM device being formed in the nonvolatile semiconductor memory device region 110. As shown in FIG. 3 a blocking mask 302 may be formed over SOI device region 108 and over substrate contact region 112 to block the ion implantation from these regions, and only allowing the ion implantation into the semiconductor memory device region 110. This blocking mask 302 can be a photoresist material formed by conventional photolithography techniques. According to one embodiment of the present invention in which an NFET NVRAM device is formed, a suitable P type dopant such as boron may be implanted into the semiconductor memory region 110 (i.e. NVRAM device) through the opening of mask 302, at a dose of approximately 1E13 atoms/cm$^2$ and an energy from approximately 20 to approximately 100 KeV. The P type dopant may be driven in for a time duration ranging from approximately 5 seconds to approximately 10 minutes at a temperature ranging from approximately 900° C. to approximately 1100° C. to form the region of P concentration of approximately 1E17 to approximately 1E19 atoms/cm$^3$. It should be noted that as the threshold adjust implant (generally shown by lines 304) is made with high energy, it penetrates through the SOI layer 106, buried insulating layer 104 deep into the substrate 102, as shown in FIG. 3. If a PFET NVRAM device is to be formed, a suitable N type dopant such as phosphorus or arsenic can be used.

Next, as shown in FIG. 4, the mask 302 may be removed and additional gate stack layers may be formed on the substrate, using any suitable process, currently known or developed in the future. These additional gate stack layers may include a gate conductor layer 404 and gate dielectric 402. For example, thin dielectric layer 402 may be grown or deposited on the SOI layer 106, followed by forming a layer 404 of conductive material on the thin dielectric layer 402. The gate conductor layer 404 may comprise any suitable gate conductor material, such as polysilicon, metal nitride materials (e.g. TiN), and metals or stacks of different conductor materials, though one layer is shown for illustrative purposes. The gate dielectric layer 402 may comprise any suitable gate dielectric material, such as oxide, nitride, high-K materials such as Hf-based dielectrics, and combination of different dielectric layers. Next, a second hard mask 406 may be formed over the gate conductor layer 404 by any suitable process to any suitable thickness, as shown in FIG. 4. The hard mask layer 406, in at least one embodiment, includes silicon oxide (SiO$_2$). The hard mask layer 406, in other embodiments, may include silicon nitride (Si$_3$N$_4$), silicon oxynitride (SiON), silicon carbide (SiC), silicon oxycarbide (SiOC), spin-on glass (SOG), a low-k film, tetraethylorthosilicate (TEOS), plasma enhanced CVD oxide (PE-oxide), amorphous carbon material, other suitable materials, and/or combinations thereof. The hard mask layer 406 may be formed using methods such as CVD, PVD, or ALD and may have a thickness ranging from approximately 5 to approximately 50 nm.

Next, the hard mask layer 406 may be patterned, as shown in FIG. 5. The formation and patterning of the hard mask 406 may be performed through any number of known processes. For example, a resist layer may be patterned (e.g., photolithography) on the hard mask layer 406 and then the hard mask layer 406 may be etched to create a FET hard mask 502 in the SOI device region 108 and a NVRAM hard mask 504 in the NVRAM device region 110. The FET hard mask 502 and the NVRAM hard mask 504 are made from the hard mask layer 406. The FET hard mask 502 and the NVRAM hard mask 504 may be used for a subsequent gate stack etching step described below.

FIG. 6 illustrates gate stack formation in the SOI device region 108 and the NVRAM device region 110. According to an exemplary embodiment, an anisotropic (e.g., silicon) RIE may be used to remove portions of gate conductor layer 404 and gate dielectric layer 402 not masked by the FET hard mask 502 and NVRAM hard mask 504. The active SOI layer 106 acts as an etch stop layer. According to an alternate embodiment of the invention, the RIE can stop on the gate dielectric layer 402, and subsequently portions of the gate dielectric layer 402 may be removed by using a short wet-etch of the exposed gate dielectric layer 402. This step completes the gate stack formation for the CMOS FET device in the SOI device region 108. However, in accordance with an embodiment of the present invention, gate stack formation for the adjacent NVRAM device may continue in the NVRAM device region 110, as described below.

Figure 7:
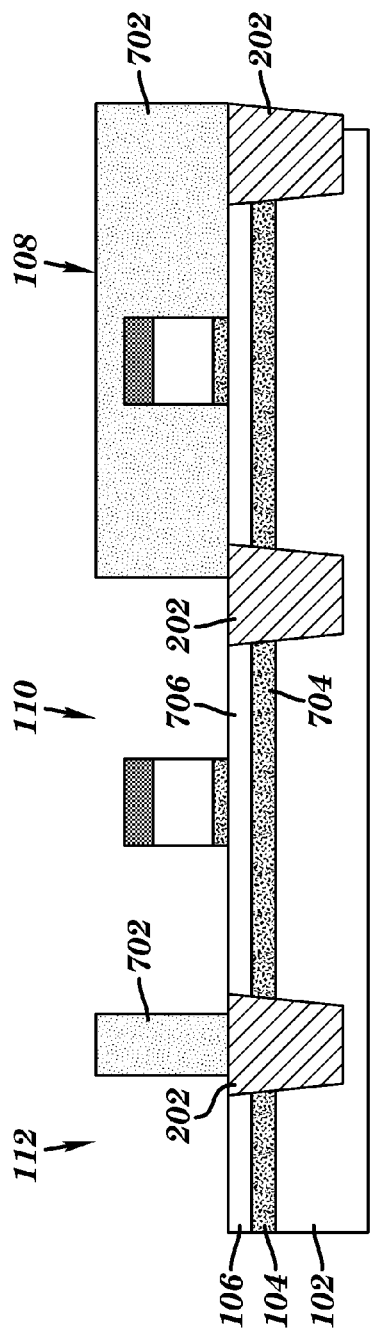
FIG. 7 is a vertical cross-sectional view of the semiconductor structure shown in FIG. 6 after another mask has been formed which exposes portions of the SOI layer and BOX layer in the NVRAM device region and a substrate contact region, according to an embodiment of the present invention.

Next, another mask 702 may be formed over the SOI device region 108 and at least portions of the STI regions 202, as shown in FIG. 7. The mask layer 702, in at least one embodiment, includes photoresist formed by conventional photolithography. The mask 702 exposes portions of the SOI layer 106 (e.g., portion 706) and buried insulating layer 104 (e.g. portion 704) in the NVRAM device region 110 and substrate contact region 112. According to an embodiment of the present invention, mask 702 may leave some portions of STI regions 202 exposed as well.

Figure 8:
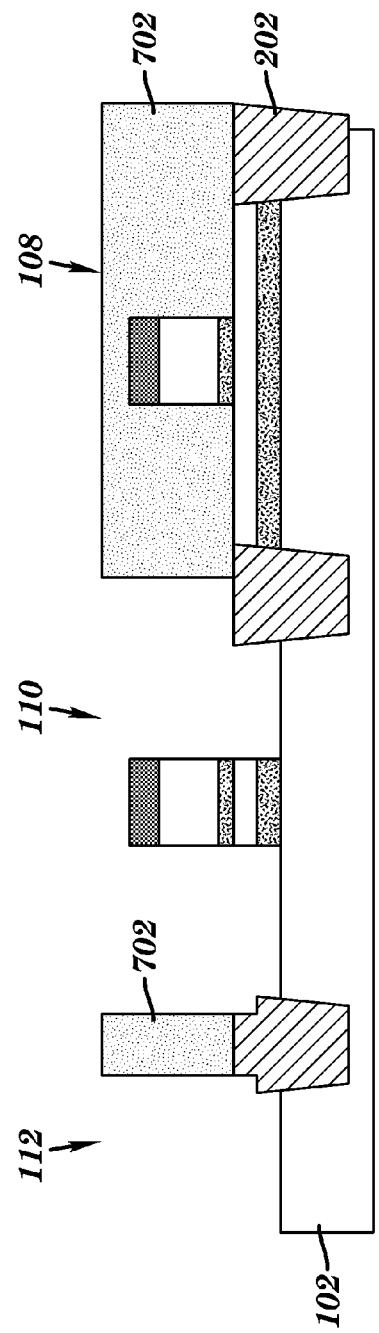
FIG. 8 is a vertical cross-sectional view of the semiconductor structure shown in FIG. 7 after removal of the exposed portions of the SOI and BOX layers, in accordance with an embodiment of the present invention.

Next, referring to FIG. 8, a conventional etching technique and chemistry may be employed to remove exposed portions of the SOI layer 106 and buried insulating layer 104. During a first etching step, the SOI layer 106 may be etched to the buried insulating layer 104. Etching may be anisotropic, which is commonly accomplished by, for example, RIE using gasses such as sulfur hexafluoride (SF$_6$), hydrogen bromide (HBr) or other gaseous compounds as etchants. Next, the buried insulating (BOX) layer 104 may be removed in exposed areas of NVRAM device region 110 and substrate contact region 112, such as by RIE or in a diluted HF solution to form the structure shown in FIG. 8.

Figure 9:
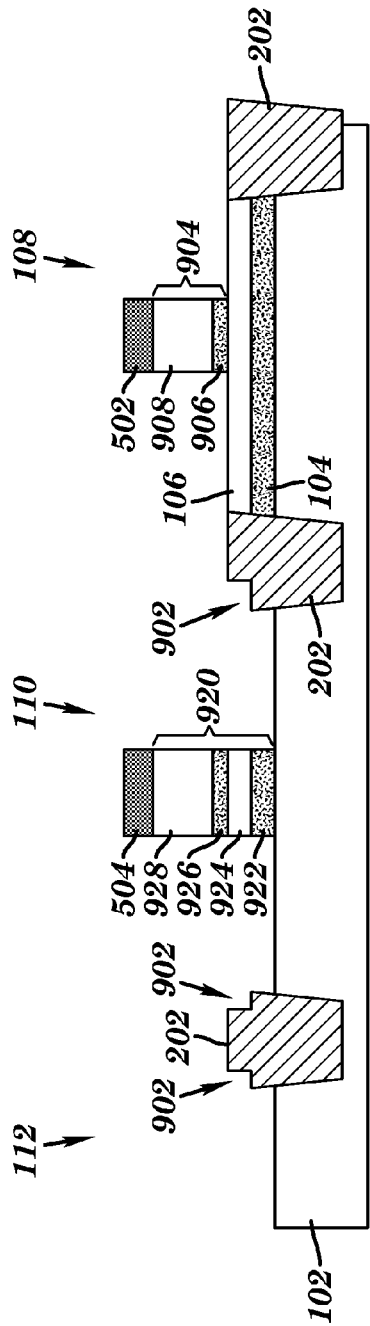
FIG. 9 is a vertical cross-sectional view of a resulting structure following the removal of the mask layer, according to an embodiment of the present invention.

FIG. 9 illustrates a resulting structure following the removal of the mask layer 702. As shown in FIG. 9, first gate stack structure 904 is formed in the SOI device region 108. The first gate stack structure 904 contains the gate dielectric layer 906 located on a portion of the active SOI layer 106. Gate dielectric layer 906 of the first gate stack structure 904 is one of the two remaining portions of the gate dielectric layer 402 described above in connection with FIG. 4. Accordingly, the gate dielectric layer 906 may comprise any suitable gate dielectric material, such as oxide, nitride, high-K materials such as Hf-based dielectrics, and combination of different dielectric layers. Furthermore, the gate stack structure 904 includes a gate conductor layer 908. Gate conductor layer 908 of the first gate stack structure 904 is one of the two remaining portions of the gate conductor layer 404 described above in connection with FIG. 4. Accordingly, the gate conductor layer 908 may comprise any suitable gate conductor material, such as polysilicon, nitride materials (e.g. TiN), and metals or stacks of different conductor or semiconductor materials. As shown in FIG. 9, the first gate stack 904 is protected by the FET hard mask 502.

FIG. 9 further illustrates second gate structure 920 formed in the NVRAM device region 110. As shown in FIG. 9, the second gate stack (memory gate stack) structure 920 includes the tunnel oxide layer 922, floating gate layer 924, blocking oxide layer 926, and a control gate layer 928. According to an embodiment of the present invention, tunnel oxide layer comprises a portion of the original buried insulating layer 104. Tunnel oxide layer 922 is used for charging or discharging of the floating gate electrode (by tunneling electrons). In a preferred embodiment, to obtain a suitable tunneling current, the buried insulating layer 104 of the commercial substrate 101 should be of the order of, for example, approximately 4 nm to approximately 15 nm. In accordance with an embodiment of the present invention, floating gate layer 924 comprises a portion of the original active SOI layer 106. Floating gate layer 924 of the second gate stack structure 920 overlies the tunnel oxide layer 922. Floating gate layer 924 comprises a storage element of a NVRAM device. In addition, in accordance with an embodiment of the present invention, blocking oxide layer 926 comprises another portion of the gate dielectric layer 402 described above in connection with FIG. 4. In an alternate embodiment, blocking oxide layer 926 comprises a different dielectric material than gate dielectric layer 402 described in connection with FIG. 4, that can be achieved by an additional masked etch and dielectric deposition sequence (not shown). In yet another embodiment, both blocking oxide layer 926 and gate dielectric layer 402 may comprise a multilayer dielectric material, which may include two or more dielectric materials having, for example, different dielectric constants. Blocking oxide layer 926 of the second gate stack structure 920 overlies the floating gate layer 924. Top layer of the second gate structure 920 is the control gate layer 928, overlying the blocking oxide layer 926. According to an embodiment of the present invention, the control gate layer 928 comprises another portion of the gate conductor layer 404 described above in connection with FIG. 4. Similarly, to the first gate stack structure 904, the second gate stack structure 920 is protected by a hard mask, the NVRAM hard mask 504 in this case. At least in one embodiment of the present invention, STI regions 202 located in both the NVRAM device region 110 and substrate contact region 112 may have a recess 902 on opposing sidewalls, as illustrated in FIG. 9. The location of this recess 902 is determined by the location of mask 702 shown in FIGS. 7 and 8, and is created by the etch of the BOX layer portion 704 described above in connection with FIG. 8.

Figure 10:
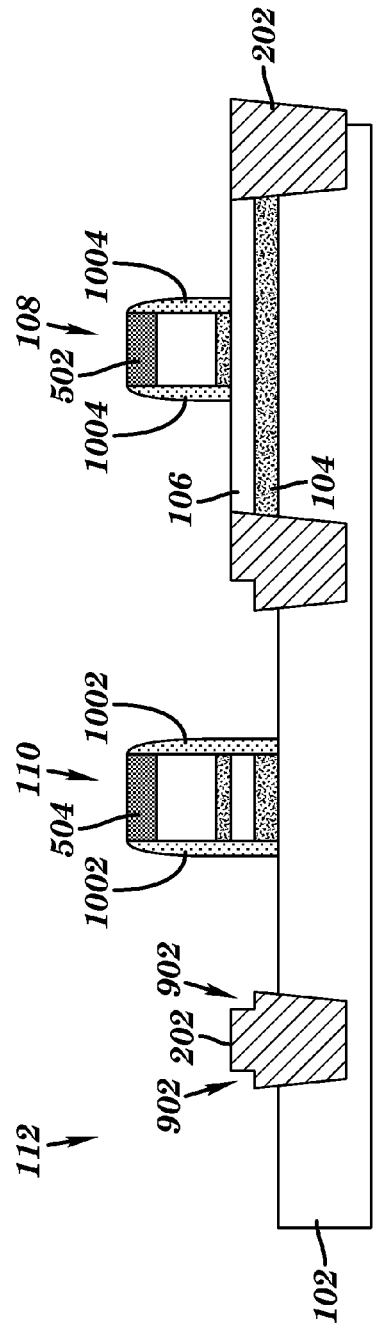
FIG. 10 is a vertical cross-sectional view of the semiconductor structure shown in FIG. 9 after spacers are formed on the sidewalls of the gate stacks, in accordance with an embodiment of the present invention.

Next, referring to FIG. 10, spacers 1002 and 1004 may be formed on the sidewalls of the gate stacks 920 and 904, respectively, using any method now known or developed in the future. In this example, the spacers 1002 are formed on both sidewalls of the second gate stack structure 920 and on both sidewalls of the NVRAM hard mask 504 in the NVRAM device region 110. Similarly, the spacers 1004 are formed on both sidewalls of the first gate stack structure 904 and on both sidewalls of the FET hard mask 502 in the SOI device region 108. The sidewall spacers 1002 and 1004 may be made of materials including, but not limited to, silicon nitride and silicon oxide, or combinations of layers and may have a horizontal thickness of approximately 2 nm to approximately 20 nm, preferably approximately 3 nm to approximately 10 nm. The sidewall spacers 1002 and 1004 may be formed, for example, by depositing an insulating layer over the first and second gate stacks using known deposition techniques including, for example, chemical vapor deposition (CVD) and atomic layer deposition (ALD) and then removing excess material on the horizontal surfaces using an anisotropic etching process, such as reactive ion etching (RIE) or plasma etching (not shown).

Figure 11:
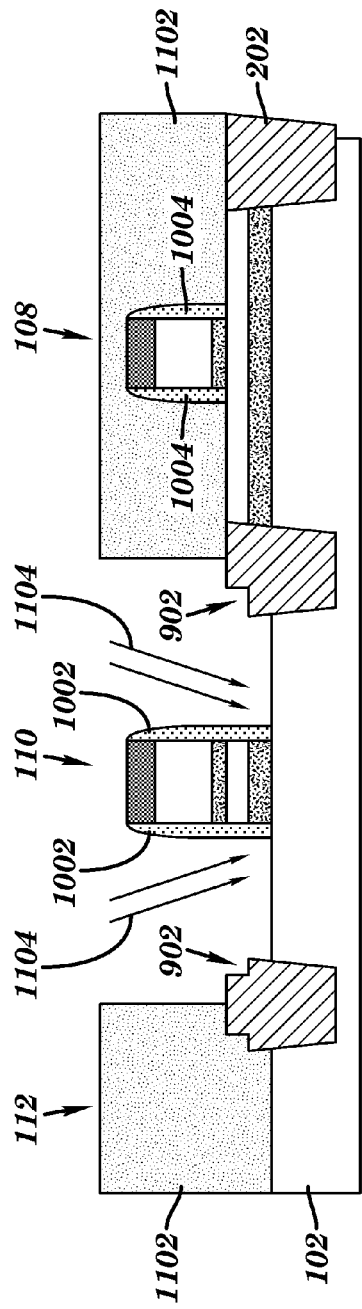
FIG. 11 is a vertical cross-sectional view of the semiconductor structure shown in FIG. 10 after an optional step of performing a halo implant, in accordance with an embodiment of the present invention.

Optionally, the sidewall spacer formation may be followed by a halo implant, illustrated in FIG. 11. As shown in FIG. 11, once the spacers 1002 and 1004 are formed another mask 1102 may be formed by photolithography to cover the SOI device region 108 and the substrate contact region 112. The mask 1102 has an opening in the NVRAM region 110. According, to an embodiment of the invention, a tilt angle implant 1104 may be possible to form halo/extension regions. As shown in FIG. 11, the implantation may be performed into the opening in the mask 1102, while it is blocked from SOI device region 108 and substrate contact region 112. In an embodiment of the present invention, the angle of the implant may be equal to approximately 5 to 40 degrees.

Figure 12:
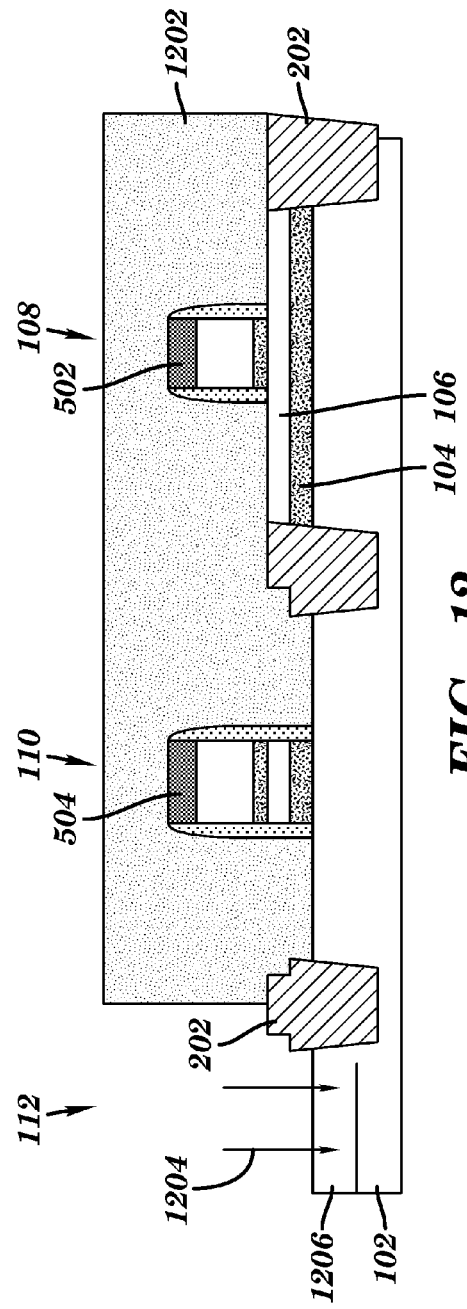
FIG. 12 is a vertical cross-sectional view of the semiconductor structure shown in FIG. 11 after an embedded contact area is formed in the substrate contact region, according to an embodiment of the present invention.

Next, referring to FIG. 12, an embedded contact area 1206 may be formed in the substrate contact region 112. As shown in FIG. 12 yet another mask 1202 may be formed by photolithography to block the introduction of substrate contact dopants implant into other active regions such as SOI device region 108 and NVRAM region 110. The embodiments of the present invention are not limited to a particular type of doping in the substrate. The ion implant process represented by arrows 1204 may be performed to implant, for example, P-type dopant materials, e.g., boron, boron di-fluoride ($BF_2$), etc., into the (p-type) substrate 102. In one illustrative example, the ion implant process 1204 is performed using at a boron dopant dose of approximately 5E15 ions/$cm^2$ and at an energy level of approximately 5 keV. In an alternative embodiment, N-type dopant materials, such as arsenic, phosphorus, and the like may be implanted into the n-type substrate 102 to form the contact area 1206. As shown in FIG. 12, the contact area 1206 is separated from the memory device formed in the NVRAM region 110 by the STI region 202.

FIG. 13 illustrates a resulting integrated structure which includes both SOI CMOS FET device formed in the region 108 and NVRAM device formed in the region 110 on a single chip. It should be noted that well-known in the art salicide process may be employed to form silicide regions 1304 on top of the gate conductors (after removing NVRAM hard mask 504 and FET hard mask 502) and to form silicide regions 1302 on top of the source/drain region in both the NVRAM device region 110 and the SOI device region 108. Next, still referring to FIG. 13, an interlevel dielectric (ILD) 1306 may be deposited over the substrate. Using standard processes, a patterned resist may be deposited (not shown) and trenches may be etched through the ILD 1306, and a metal, such as tungsten or titanium nitride, may be deposited in the trenches, resulting in contacts 1308 to the silicide regions 1302 in both the NVRAM device region 110 and the SOI device region 108. Similarly, silicide region 1302 may be formed above the substrate contact area 1206 in the substrate contact region 112 and contact 1308 may be formed in the substrate contact region 112 to provide electrical connection to the contact area 1206. Similarly, contacts are formed to provide electrical contact to the gate silicide regions 1304 of the SOI FET gate and the NVRAM device control gate (not shown). Additionally, using standard processes, metal wiring using copper or aluminum may be formed to interconnect the SOI FETs and NVRAM devices to form a semiconductor structure.

To summarize, in accordance with an embodiment of the present invention shown in FIG. 13, a SOI CMOS device is formed in the SOI device region 108 and a NVRAM device is formed in the NVRAM device region 110. In accordance with an embodiment of the present invention, the tunnel oxide layer 922 of the NVRAM device is coplanar and made of the same material as a portion of the buried insulating layer (BOX) 104 in the SOI device region 108. This usage of a portion of the BOX layer for both the BOX 104 and the tunnel oxide 922 advantageously eliminates at least one thermal cycle to form an additional oxide. In accordance with another aspect of the present invention the floating gate layer 924 of the NVRAM device is coplanar and made of the same material as the active SOI layer 106 in the SOI device region 108. According to yet another aspect of the present invention, the blocking oxide layer 926 of the NVRAM device is coplanar and optionally made of the same material as the gate dielectric layer 906 of the SOI FET, though it is contemplated that the blocking oxide layer 926 can be a different material than gate dielectric layer 906. According to yet another aspect of the present invention, NVRAM control gate 928 is coplanar and optionally made of the same material as SOI FET gate 908. According to yet another aspect of the present invention, a substrate contact may be formed in the substrate contact region 112 substantially simultaneously with the NVRAM device formed in the NVRAM device region 110.

Even though a single NVRAM device and a single SOI FET is shown for illustration purposes, it should be understood that multiple NVRAM devices and multiple SOI FETs can be constructed in NFET and PFET varieties to form semiconductor structures. As another example, while a gate-first integration flow is described in forming the NVRAM control gate 928, the SOI FET gate 908, the NVRAM blocking oxide 926 and the SOI FET gate dielectric 906, it should be understood that embodiments of the present invention can be equally applied for alternate CMOS gate integration flows, such as the Replacement Metal Gate (RMG) flow.

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A method of manufacturing a semiconductor structure, the method comprising:
    forming an SOI layer on a BOX layer, the BOX layer is on a substrate;
    forming an STI region extending vertically through the SOI layer, the BOX layer, and a portion of a substrate, the STI region defines boundaries of an SOI device region and a nonvolatile memory device region, a top surface of the STI region is coplanar with a top surface of the SOI layer;
    forming a gate dielectric layer on the SOI layer and the STI region;
    forming a gate conductor layer on the gate dielectric layer;
    forming a hard mask layer on the gate conductor layer;
    forming a FET hard mask and a NVRAM hard mask by patterning the hard mask layer, the FET hard mask is above the SOI device region and the NVRAM hard mask is above the nonvolatile memory device region;
    forming a first gate stack in the SOI device region and a second gate stack in the nonvolatile memory device region, the first and second gate stacks comprising a portion of the gate dielectric layer and a portion of the gate conductive layer, the first stack is masked by the FET hard mask and the second stack is masked by the NVRAM hard mask;
    selectively removing portions of the SOI layer in the nonvolatile semiconductor memory device region to form a floating gate layer of the second gate stack; and
    selectively removing portions of a BOX layer in the nonvolatile semiconductor memory device region to form a tunnel oxide layer of the second gate stack.

2. The method of claim 1, further comprising implanting a threshold adjust dopant into a semiconductor substrate portion of the nonvolatile semiconductor memory device region.

3. The method of claim 1, further comprising forming at least one contact trench in a substrate contact region of the SOI substrate adjacent to the nonvolatile semiconductor memory device region, the at least one contact trench including a contact that is electrically connected to the semiconductor substrate.

4. The method of claim 1, wherein the first gate stack comprises a SOI FET device and the second gate stack comprises a nonvolatile memory device.

5. The method of claim 4, wherein the SOI FET is an n-type field effect transistor (NFET) or a p-type field effect transistor (PFET).

6. The method of claim 4, further comprising forming a first pair of sidewall spacers on sidewalls of the SOI FET device and forming a second pair of sidewall spacers on sidewalls of the nonvolatile memory device.

7. The method of claim 1, wherein the BOX layer has a thickness of approximately 3 nm to approximately 20 nm.

8. The method of claim 1, wherein the SOI layer has a thickness of approximately 3 nm to approximately 10 nm.

* * * * *